(12) United States Patent
Faiz et al.

(10) Patent No.: US 11,101,227 B2
(45) Date of Patent: Aug. 24, 2021

(54) COUPLED LINE STRUCTURES FOR WIDEBAND APPLICATIONS

(71) Applicant: Analog Devices International Unlimited Company, Co. Limerick (IE)

(72) Inventors: Mir A. Faiz, Andover, MA (US); Song Lin, Burlington, MA (US); Xudong Wang, Colorado Springs, CO (US)

(73) Assignee: Analog Devices International Unlimited Company, Limerick (IE)

( * ) Notice: Subject to any disclaimer, the term of this patent is extended or adjusted under 35 U.S.C. 154(b) by 133 days.

(21) Appl. No.: 16/514,444

(22) Filed: Jul. 17, 2019

(65) Prior Publication Data
US 2021/0020589 A1    Jan. 21, 2021

(51) Int. Cl.
| | |
|---|---|
| *H03F 3/68* | (2006.01) |
| *H03F 3/195* | (2006.01) |
| *H01L 23/66* | (2006.01) |
| *H01L 23/522* | (2006.01) |
| *H01P 5/02* | (2006.01) |

(Continued)

(52) U.S. Cl.
CPC ............ *H01L 23/66* (2013.01); *H01L 23/528* (2013.01); *H01L 23/5226* (2013.01); *H01P 5/028* (2013.01); *H01P 5/12* (2013.01); *H03F 3/68* (2013.01); *H01L 29/20* (2013.01); *H01L 29/2003* (2013.01); *H01L 2223/6616* (2013.01); *H01L 2223/6627* (2013.01);

(Continued)

(58) Field of Classification Search
CPC ... H01L 23/66; H01L 23/5226; H01L 23/528; H01L 2223/6683; H01L 2223/6627; H01L 29/2003; H01L 29/20; H01L 2223/6616; H01P 5/028; H01P 5/12; H03F 3/68; H03F 3/195; H03F 2200/451; H03F 2200/06; H03F 2200/09
USPC .................................................. 330/301, 307
See application file for complete search history.

(56) References Cited

U.S. PATENT DOCUMENTS

| | | | |
|---|---|---|---|
| 4,954,790 | A | 9/1990 | Barber |
| 5,060,298 | A | 10/1991 | Waugh et al. |

(Continued)

FOREIGN PATENT DOCUMENTS

| | | |
|---|---|---|
| CN | 207587946 U | 7/2018 |
| DE | 69724469 T2 | 4/2004 |

(Continued)

OTHER PUBLICATIONS

Bhat et al. "Broadside-Coupled and Broadside Edge-Coupled Stripline-Like Transmission Lines with Anisotropic Substrates" dated Dec. 17, 1985, in 10 pages.

(Continued)

*Primary Examiner* — Hieu P Nguyen
(74) *Attorney, Agent, or Firm* — Knobbe, Martens, Olson & Bear, LLP

(57) ABSTRACT

Coupled line structures for wideband applications are provided herein. In certain embodiments, a coupled line structure includes one transmission line that is segmented in a metal layer and another that is substantially continuous in the metal layer, thereby allowing tighter spacing and higher coupling between the transmission lines relative to what is achievable if both transmission lines were continuous. The high coupling in turn aids in achieving wide bandwidth.

20 Claims, 12 Drawing Sheets

(51) Int. Cl.
*H01P 5/12* (2006.01)
*H01L 23/528* (2006.01)
*H01L 29/20* (2006.01)

(52) U.S. Cl.
CPC .. *H01L 2223/6683* (2013.01); *H03F 2200/06* (2013.01); *H03F 2200/09* (2013.01); *H03F 2200/451* (2013.01)

(56) References Cited

U.S. PATENT DOCUMENTS

| | | | |
|---|---|---|---|
| 5,313,175 | A | 5/1994 | Bahl et al. |
| 5,355,104 | A | 10/1994 | Wolfson et al. |
| 5,523,728 | A | 6/1996 | McCorkle |
| 5,534,830 | A | 7/1996 | Ralph |
| 5,644,272 | A | 7/1997 | Dabrowski |
| 5,767,753 | A | 6/1998 | Ruelke |
| 5,867,072 | A | 2/1999 | Logothetis |
| 6,018,277 | A | 1/2000 | Vaisanen |
| 6,133,525 | A | 10/2000 | Yang et al. |
| 6,437,658 | B1 | 8/2002 | Apel et al. |
| 6,483,415 | B1 | 11/2002 | Tang |
| 6,670,866 | B2 | 12/2003 | Ella et al. |
| 6,683,510 | B1 | 1/2004 | Padilla |
| 6,819,200 | B2 | 11/2004 | Zhao et al. |
| 6,882,240 | B2 | 4/2005 | Apel |
| 6,954,116 | B2 | 10/2005 | Nosaka |
| 6,961,990 | B2 | 11/2005 | Logothetis |
| 7,183,872 | B2 | 2/2007 | Lee et al. |
| 7,215,218 | B2 | 5/2007 | Burns et al. |
| 7,265,644 | B2 | 9/2007 | Floyd et al. |
| 7,336,142 | B2 | 2/2008 | Vogel |
| 7,400,214 | B2 | 7/2008 | Storniolo et al. |
| 7,453,327 | B2 | 11/2008 | Fluhrer |
| 7,605,672 | B2 | 10/2009 | Kirkeby |
| 7,692,512 | B2 | 4/2010 | Podell |
| 7,741,929 | B2 | 6/2010 | Hash |
| 7,746,174 | B2 * | 6/2010 | Yang ........................ H01L 23/66 330/295 |
| 7,961,064 | B2 | 6/2011 | Kearns et al. |
| 8,547,186 | B2 | 10/2013 | Kirkeby |
| 8,598,964 | B2 | 12/2013 | Podell |
| 9,065,161 | B2 | 6/2015 | Hu et al. |
| 9,312,815 | B2 | 4/2016 | Wang et al. |
| 9,768,736 | B2 | 9/2017 | Qureshi |
| 9,787,279 | B2 | 10/2017 | Tanaka |
| 10,911,016 | B2 | 2/2021 | Lin et al. |
| 2007/0285189 | A1 | 12/2007 | Wu et al. |
| 2009/0243750 | A1 | 10/2009 | Podell |
| 2013/0321080 | A1 | 12/2013 | Jahanian et al. |
| 2016/0352303 | A1 | 12/2016 | Tutsumi et al. |
| 2017/0026201 | A1 | 1/2017 | Mei et al. |
| 2017/0279430 | A1 | 9/2017 | Qureshi |
| 2018/0123551 | A1 | 5/2018 | Pye |
| 2019/0051964 | A1 | 2/2019 | Senior et al. |
| 2020/0220516 | A1 | 7/2020 | Lin et al. |

FOREIGN PATENT DOCUMENTS

| | | |
|---|---|---|
| EP | 0337191 | 10/1989 |
| EP | 0869574 B1 | 11/2005 |
| JP | H 06276045 | 9/1994 |
| JP | 2002217616 | 8/2002 |
| JP | 2004072115 A | 3/2004 |
| JP | 3728293 B2 | 12/2005 |
| JP | 2006270444 | 10/2006 |
| JP | 2011044961 | 3/2011 |
| JP | 4674590 B2 | 4/2011 |

OTHER PUBLICATIONS

Bhat et al. "Unified Approach to Solve a Class of Strip and Microstrip-Like Transmission Lines" dated May 1982, in 8 pages.
Chiang et al. "Artificial-Synthesized Edge-Coupled Transmission Lines for Compact CMOS Directional Coupler Designs" dated Dec. 2009, in 8 pages.
Guo et al., "Design of Miniaturized LTCC Baluns" 2006 IEEE MTT-S International Microwave Symposium Digest, in 12 pages.
Hsu et al., "Uniplanar Broad-Band Push-Pull FET Amplifier," IEEE Transactions on Microwave Theory and Techniques, vol. 45, No. 12, Dec. 1997, in 3 pages.
Lan et al., "An Ultra-Wideband Balun Using Multi-Metal GaAs MMIC Technology", IEEE Microwave and Wireless Components Letters, vol. 20, Aug. 2010, in 3 pages.
Lim et al., "A 800- to 3200-MHz Wideband CPW Balun Using Multistage Wilkinson Structure" IEEE Microwave Symp. Digest, pp. 1141-1144, Jun. 2006, in 4 pages.
Nelapati et al., "Design, Simulation, Fabrication and Testing of Improved Hybrid Wideband Balun Circuits at 2.4GHz" 2010 in 41 pages.
Rogers et al., "A 6 to 20 GHz Planar Balun Using a Wilkinson Divider and Lange Couplers" 1991 IEEE MTT-S International Microwave Symposium Digest, Boston, MA, in 4 pages.
Ruthroff, "Some Broad-Band Transformers" Proceedings of the IRE, vol. 47, Aug. 1959, pp. 1337-1342 in 6 pages.
Sevick, "Transmission Line Transformers", Noble Publishing Corporation, 2001, in 289 pages.
Turrin, W2IMU, "Application of Broad-Band Balun Transformers," QST, Apr. 1969, in 4 pages.
Watkins, "Enhancing Second Harmonic Suppression in an Ultra-Broadband RF Push-Pull Amplifier," High Frequency Design, pp. 32-40, Mar. 2014 in 7 pages.
Wu et al., "A Wideband Microstrip Dual Balun Structure" 2015 IEEE MTT-S International Microwave Symposium, in 3 pages.
Yoon, et al., "A Silicon Monolithic Spiral Transmission Line Balun with Symmetrical Design", IEEE Electron Device Letters, 1999, in 3 pages.

* cited by examiner

COUPLED LINE STRUCTURES FOR WIDEBAND APPLICATIONS

FIELD OF THE DISCLOSURE

Embodiments of the invention relate to electronic systems, and more particularly, to coupled line structures.

BACKGROUND

Certain electronic systems include coupled line structures. For instance, one type of coupled line structure is a balun, which operates between a balanced differential transmission path and an unbalanced, single-ended transmission path. For example, a balun can provide signal conversion in an RF communication system between a single-ended RF signal received from an antenna and a differential RF signal suitable for processing by the system's differential RF circuitry.

Coupled line structures can be used in a wide variety of electronic systems, including, for example, radio frequency and microwave electronics. Example applications for coupled line structures include push-pull amplifiers, mixers, phase shifters, impedance transformers, and antenna feeds.

SUMMARY OF THE DISCLOSURE

Coupled line structures for wideband applications are provided herein. In certain embodiments, a coupled line structure includes one transmission line that is segmented in a metal layer and another that is substantially continuous in the metal layer, thereby allowing tighter spacing and higher coupling between the transmission lines relative to what is achievable if both transmission lines were continuous. For example, design rules for a particular fabrication process may specify a certain minimum gap or spacing between adjacent continuous metal routes in a particular metallization layer. However, the minimum gap restrictions can be relaxed to allow closer spacing if at least one of the adjacent metal regions is non-continuous. By implementing a coupled line structure in this manner, coupling is increased to provide wide bandwidth operation and a compact layout. Such coupled line structures can be used in a wide range of applications, including, but not limited to, baluns, push-pull amplifiers, mixers, and/or impedance transformers.

In one aspect, a semiconductor die with an integrated wideband coupled line structure is provided. The semiconductor die includes two or more metallization layers including a first metallization layer and a second metallization layer, a first transmission line formed in the two or more metallization layers, and a second transmission formed in the two or more metallization layers and coupled to the first transmission line. Additionally, the first transmission line is substantially continuous in the second metallization layer, and the second transmission line is segmented in the second metallization layer.

In another aspect, a coupled line structure with wide bandwidth is provided. The coupled line structure includes a first transmission line including a first metal route in an upper metallization layer of a semiconductor die. The coupled line structure further includes a second transmission line including a plurality of metal segments in the upper metallization layer, a second metal route in a lower metallization layer of the semiconductor die, and a plurality of vias connecting the second metal route to the plurality of metal segments. The first metal route of the first transmission line is coupled to the plurality of metal segments of the second transmission line.

In another aspect, a method of transmission line coupling is provided. The method includes providing a radio frequency signal to a first transmission line, the first transmission line including a first metal route in an upper metallization layer of a semiconductor die. The method further includes coupling the radio frequency signal from the first transmission line to a second transmission line, the second transmission line including a plurality of metal segments in the upper metallization layer. The method further includes providing the coupled radio frequency signal to a second metal route of the second transmission line by way of a plurality of vias, the second metal route in a lower metallization layer of the semiconductor die.

DETAILED DESCRIPTION OF EMBODIMENTS

Figure 1A:
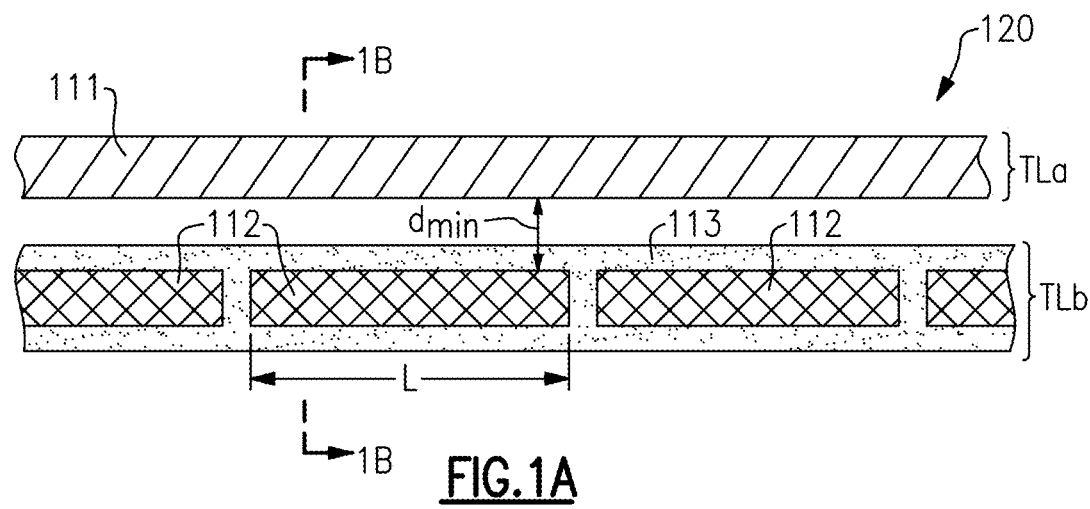
FIG. 1A is a plan view of a coupled line structure according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Conventional coaxial-line or magnetic-core coupled structures suffer from a number of disadvantages. For example, such coupled structures can suffer from limited operating frequency, poor insertion loss, high phase imbalance, high amplitude imbalance, and/or large size.

To enhance integration of electronic systems operating in radio frequency (RF) and/or microwave frequency ranges, it is desirable to implement coupled structures on a semiconductor die, such as a monolithic microwave integrated circuit (MMIC), using transmission lines. Coupled structures implemented using transmission lines are referred to herein as coupled line structures. Advantages of such integration include size reduction and large-scale production, which in turn results in lowered costs. Examples of fabrication processes suitable for MMICs include, but are not limited to, silicon processes and compound semiconductor processes, such as gallium arsenide (GaAs) or gallium nitride (GaN) technologies.

Thus, coupled line structures are fabricated using transmission lines rather than coaxial-lines and/or magnetic-cores. In a first example, a coupled transmission line balun can be formed using coplanar striplines, also referred to as micro-striplines, of conductive material positioned over a substrate and magnetically coupled to one another.

Manufacturing processes for semiconductor dies provide minimum gap restrictions for adjacent continuous metal routes. For example, design rules for a particular fabrication process may specify a certain minimum gap or spacing between adjacent continuous metal routes in a particular metallization layer. However, the minimum gap restrictions can be relaxed to allow closer spacing if one or both of the adjacent metal regions are non-continuous. For example, the design rules for the same process may permit half the minimum spacing of continuous routes if the length of at least one of the adjacent routes is less than a certain length.

Coupled line structures for wideband applications are provided herein. In certain embodiments, a coupled line structure includes one transmission line that is segmented in a metal layer and another that is substantially continuous in the metal layer, thereby allowing tighter/closer spacing and higher coupling between the transmission lines relative to what is achievable if both transmission lines were continuous.

By implementing a coupled line structure in this manner, coupling is increased, thereby allowing the coupled line structure to be implemented in a compact layout. Such coupled line structures can be used in a wide range of applications, including, but not limited to, baluns, push-pull amplifiers, mixers, and/or impedance transformers.

The coupled line structures herein can handle signals of a variety of frequencies, including not only RF signals between 100 MHz and 7 GHz, but also signals of higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF systems, including microwave systems.

In contrast, conventional transformer coupled structures have a relatively narrow operating frequency range. For example, to achieve efficient magnetic coupling, a conventional transformer balun can implement the self-impedances of the primary and secondary inductors to be relatively higher than the terminal impedance. Thus, the lowest frequency of operation of such baluns is limited by the amount of inductance in the balun, and the upper end of the operating frequency is limited by parasitic capacitance (for instance, due to resonance with the inductors). Such limitations hinder the ability of the conventional transformer balun to operate over a broad frequency range since the lowest frequency is based on sizing with large dimensions to achieve high inductance while the highest frequency is based on sizing with small dimensions to achieve low parasitic capacitance.

Figure 1B:
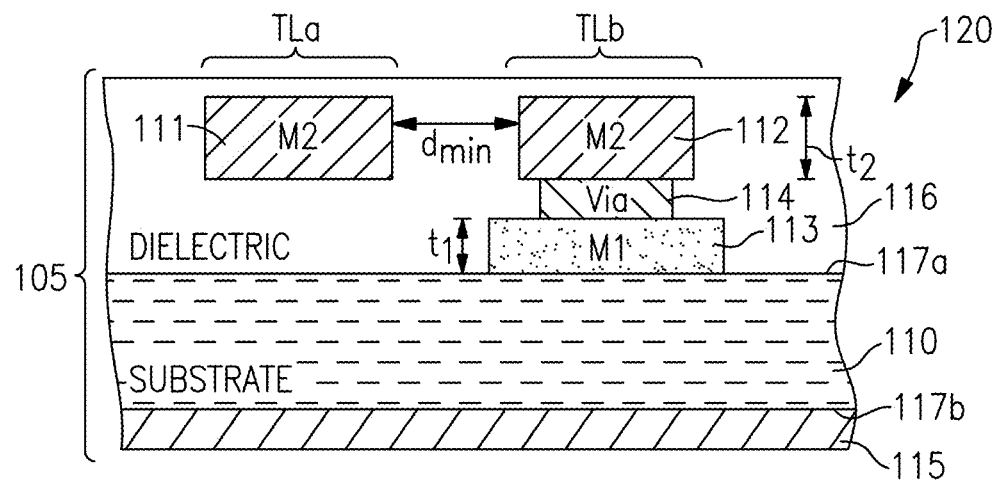
FIG. 1B is a cross-section of the coupled line structure of FIG. 1A taken along the lines 1B-1B.

FIG. 1A is a plan view of a coupled line structure 120 according to one embodiment. FIG. 1B is a cross-section of the coupled line structure 120 of FIG. 1A taken along the lines 1B-1B.

With reference to FIGS. 1A and 1B, the coupled line structure 120 is formed on a semiconductor die 105 that includes a substrate 110, a first metal layer (M1), a second metal layer (M2), dielectric 116 separating M1 and M2, and a backside metal layer including a ground plane 115.

The coupled line structure 120 includes one transmission line TLa including a M2 route 111, and another transmission line TLb including a M1 route 113 that is connected by vias 114 to M2 sections or segments 112. The M2 route 111 and the M2 sections 112 are electromagnetically coupled, and thus the transmission line TLa and the transmission line TLb are coupled in M2, in this embodiment. Although the coupled line structure 120 is illustrated as including two transmission lines, the teachings herein are applicable to coupled line structures including additional transmission lines. Furthermore, although the illustrated portions of the transmission line TLa and the transmission line TLb are straight in this embodiment, the teachings herein are applicable to transmission lines of other shapes, for instance, loops and/or coils.

Manufacturing processes for semiconductor dies provide minimum gap restrictions for adjacent continuous metal routes. For example, design rules for a particular fabrication process may specify a minimum gap or spacing of 4 μm between adjacent continuous metal routes in M2. However, the minimum gap restrictions can be relaxed if one or both of the adjacent metal regions are non-continuous. For example, the design rules for the same process may permit a 2 μm gap if the length of at least one of the adjacent M2 routes is less than 50 μm.

In the illustrated embodiment, the transmission line TLb includes M2 sections 112 rather than a continuous M2 route to allow tighter spacing to the transmission line TLa. Thus, the M2 metallization of the transmission line TLb is broken up or partitioned into segments or sections to allow reliable manufacture with tight spacing (and thus efficient energy transfer) with respect to the transmission line TLa. Additionally, vias 114 are used to connect the M2 sections 112 to the M1 route 113. As shown in FIGS. 1A and 1B, the transmission line TLa omits vias and an M1 route to avoid manufacturability and/or design rule issues in M1.

Thus, the transmission line TLa and the transmission line TLb are edge coupled in M2 with a close spacing for efficient coupling. For example, a spacing or gap between the M2 route 111 of transmission line TLa and M2 sections 112 of transmission line TLb can be implemented as a minimum spacing $d_{min}$ between M2 regions permitted by the manufacturing technology. Minimum spacing $d_{min}$ is achieved by limiting a length L of the M2 sections 112, for instance, to 50 µm or less. Although the length of the M2 sections 112 is limited to allow tight spacing to the M2 route 111, each of the M2 sections 112 can have the same or a different length less than the limit for tight spacing.

Since upper metal (for instance, M2) is typically thicker than lower metal (for instance, M1), implementing the coupled line structure 120 as shown advantageously allows the transmission line TLa and the transmission line TLb to be implemented in thick metal with low resistance while still being closely spaced. For instance, in the illustrated embodiment, a thickness $t_2$ of M2 is greater than a thickness $t_1$ of M1. This in turn provides low insertion loss through the coupled line structure, which enhances performance.

Furthermore, tightly spacing the transmission line TLa and the transmission line TLb can provide electromagnetic coupling of both magnetic and electric fields, thereby providing further enhancing energy transfer between the transmission lines.

In the illustrated embodiment, the substrate 110 includes an active side 117a on which semiconductor devices (for instance, transistors) are fabricated and a non-active side 117b opposite the active side 117a. Additionally, the metal layers (M1 and M2, in this example), contacts, and vias are formed over the active side 117a of the substrate 110 during back-end-of-line (BEOL) processing to provide desired interconnectivity between semiconductor devices. BEOL processing is also referred to as back-end processing. In certain implementations, bond pads (for instance, for wire bonding and/or solder bumps) are also formed in M2. Thus, in certain implementations, the transmission lines are coupled in the same metal as the die's bond pads.

Since the semiconductor die 105 includes two metallization layers over the active side 117a of the substrate 110, the semiconductor die 105 is fabricated using a two metal process. For example, the semiconductor die 105 can correspond to a compound semiconductor die, such as a GaAs or GaN die, fabricated in a process offering only 2 available metal layers. Accordingly, in certain implementations, the transmission lines are coupled in a die's outermost or top metal layer with respect to the die's active side 117a.

Although an example with a semiconductor die fabricated with a 2-layer metal process is shown, the teachings herein are also applicable fabrication processes providing additional metal layers. In one example, a fabrication process for a semiconductor die provides three metal layers, and the semiconductor die is implemented with a coupled line structure including one transmission line substantially continuous in the third metal layer (M3) and another segmented in M3. In another example, a fabrication process for a semiconductor die provides three metal layers, and the semiconductor die is implemented with a coupled line structure including one transmission line substantially continuous in M2 and another segmented in M2.

As shown in FIG. 1B, the substrate 110 has also been processed to form a backside metal layer on the non-active side 117b of the substrate 110. Additionally, the backside metal layer includes a ground plane 115 that is electrically connected to ground during operation. In certain implementations, the substrate 110 includes one or more through wafer vias (TWVs) for connecting portions of the backside metal layer to portions of M1.

Although the semiconductor die 105 is illustrated as including the backside metal layer, the teachings herein are also applicable to semiconductor dies fabricated using processes lacking backside metallization.

In certain implementations, semiconductor die 105 is a compound semiconductor die, such as III-V semiconductor die. Thus, the substrate 110 can be formed of a compound semiconductor material or include a compound semiconductor layer on which semiconductor devices are formed. In a first example, the substrate 110 is a GaAs substrate. In a second example, the substrate 110 includes a carrier substrate, such as silicon carbide (SiC), over which a GaN layer is formed.

Figure 2A:
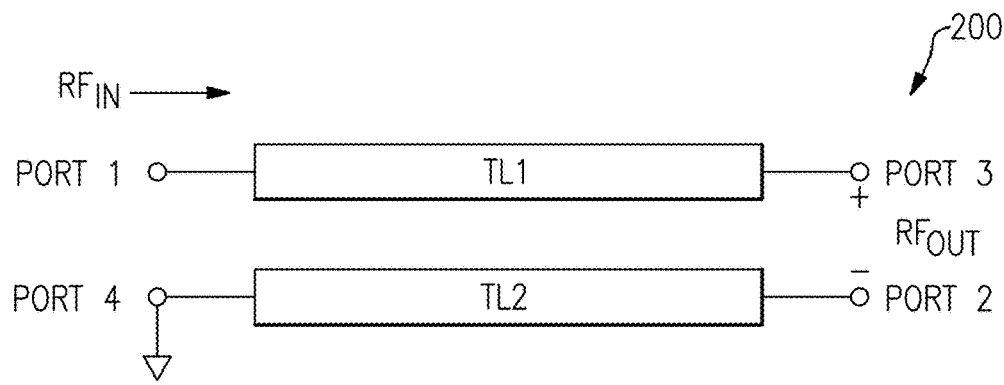
FIG. 2A is a schematic diagram of a balun according to one embodiment.

FIG. 2A is a schematic diagram of a balun 200 according to one embodiment. The balun 200 includes a first transmission line TL1, a second transmission line TL2, a first port 1, a second port 2, a third port 3, and a fourth port 4. As shown in FIG. 2A, the first transmission line TL1 is connected between the port 1 and the third port 3, while the second transmission line TL2 is connected between the fourth port 4 and the second port 2.

The first transmission line TL1 and the second transmission line TL2 are coupled to one another, for instance, negatively coupled magnetically. The first transmission line TL1 and the second transmission line TL2 can be implemented in accordance with any of the embodiments herein, for instance, using the coupled line structure 120 of FIGS. 1A-1B. For example, one of the first transmission line TL1 or the second transmission line TL2 can be implemented as transmission line TLa, while the other of the first transmission line TL1 or the second transmission line TL2 can be implemented as transmission line TLb.

When an unbalanced or single-ended signal $RF_{IN}$ is applied at the first port 1, a balanced or differential signal $RF_{OUT}$ is generated between the third port 3 and the second port 2. Since the first transmission line TL1 and the second transmission line TL2 are negatively coupled magnetically, a phase inversion is provided at the second port 2.

Accordingly, when a single-ended signal $RF_{IN}$ is applied to the first port 1 with the fourth port 4 grounded, the signal phase at the second port 2 is about 180 degrees different from the signal phase at the third port 3. Conversely, when a differential signal is applied between the third port 3 and the second port 2, the components of the differential signal combine to generate a single-ended signal as an output at the first port 1.

Figure 2B:
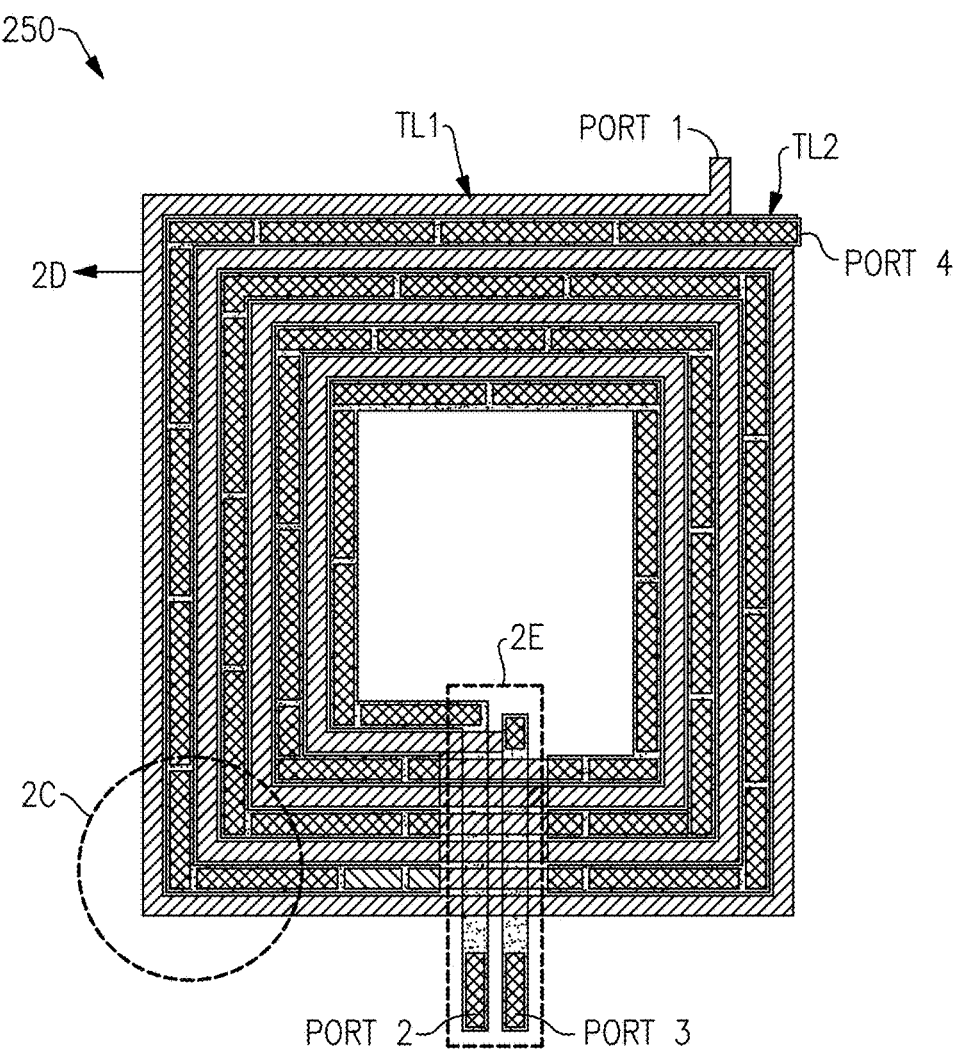
FIG. 2B is a plan view of a balun according to another embodiment.
Figure 2C:
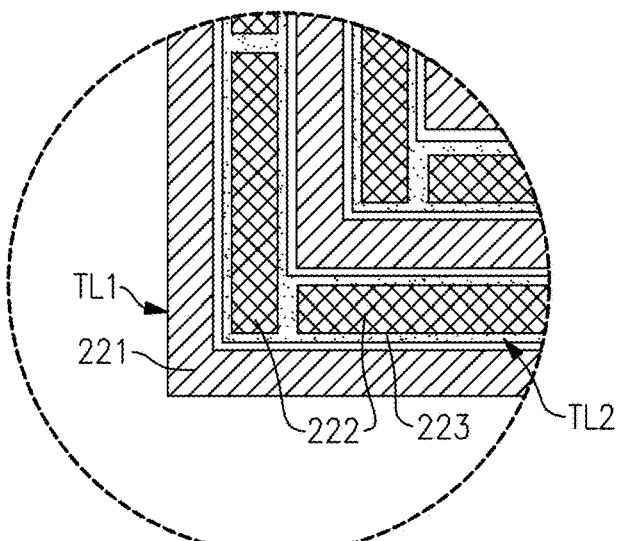
FIG. 2C is a plan view of a portion 2C of the balun of FIG. 2B.
Figure 2D:
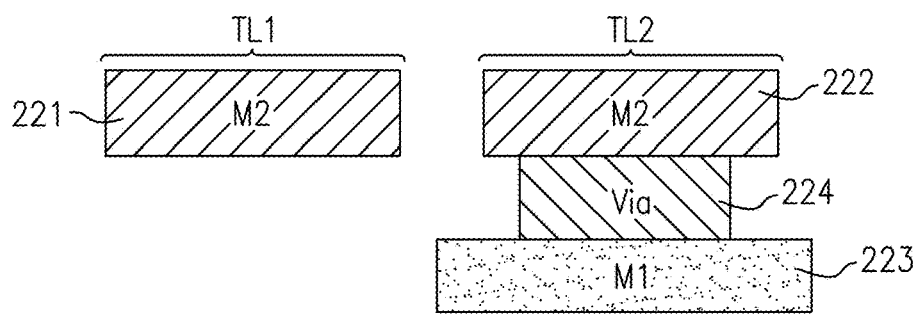
FIG. 2D is a cross-section of a portion of the balun of FIG. 2B taken along the line 2D.
Figure 2E:
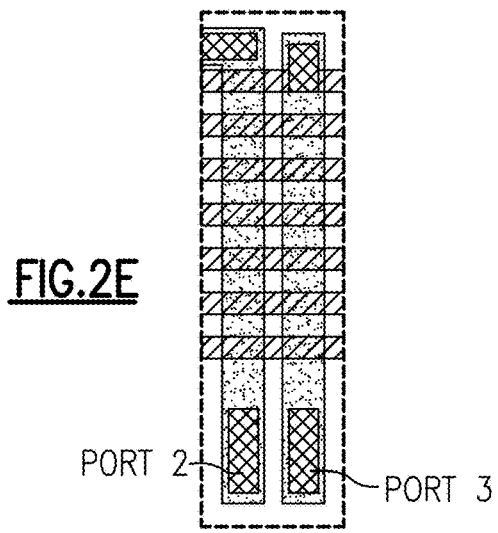
FIG. 2E is a plan view of a portion 2E of the balun of FIG. 2B.

FIG. 2B is a plan view of a balun 250 according to another embodiment. FIG. 2C is a plan view of a portion 2C of the balun 250 of FIG. 2B. FIG. 2D is a cross-section of a portion of the balun 250 of FIG. 2B taken along the line 2D. FIG. 2E is a plan view of a portion 2E of the balun 250 of FIG. 2B. The balun 250 illustrates one embodiment of the balun 200 of FIG. 2A implemented in accordance with the teachings herein.

The balun 250 includes a first port 1, a second port 2, a third port 3, a fourth port 4, a first transmission line TL1, and a second transmission line TL2. The balun 250 is implemented using a first metallization layer (M1), a second metallization layer (M2), and vias interconnecting portions of M1 and M2. Although not shown in FIG. 2B, other structures can be present, such as dielectric, a substrate, and additional metallization.

Accordingly, the balun 250 can be implemented in processes providing only two metals, for instance, commercial GaAs or GaN processes offering only 2 available metal layers.

To reduce layout area (and thus die size), the first transmission line TL1 and the second transmission line TL2 are routed together in a spiral structure providing desired length of the transmission lines.

The balun 250 includes an M2 route 221 of the first transmission line TL1, M2 sections 222 of the second transmission line TL2, and an M1 route 223 of the second transmission line TL2.

The M2 sections 222 of the second transmission line TL2 and the M1 route 223 of the second transmission line TL2 are connected by vias 224. Such vias 224 connect each of the M2 sections 222 to the M1 route 223. Thus, the second transmission line TL2 is implemented on both M1 and M2, in this example.

With reference to FIGS. 2B-2E, the first transmission line TL1 and the second transmission line TL2 are edge coupled. In certain implementations, energy is transferred between the first transmission line TL1 and the second transmission line TL2 using both electric and magnetic fields. To provide strong coupling and efficient energy transfer, a small gap between the first transmission line TL1 and the second transmission line TL2 is advantageous.

Manufacturing processes for semiconductor dies provide minimum gap restrictions for adjacent continuous metal routes. For example, design rules for a particular fabrication process may specify a minimum gap or spacing of 4 µm between adjacent continuous metal routes in M2. However, the minimum gap restrictions can be relaxed if one or both of the adjacent metal regions are non-continuous. For example, the design rules for the same process may permit a 2 µm gap if the length of at least one of the adjacent M2 routes is less than 50 µm.

In the illustrated embodiment, the second transmission line TL2 includes M2 sections 222 rather than a continuous M2 route to allow tighter spacing to the first transmission line TL1. Thus, the M2 metallization of the second transmission line TL2 is broken up or partitioned into segments or sections to allow reliable manufacture with tight spacing (and thus efficient energy transfer) with respect to the first transmission line TL1. Additionally, vias 224 are used to connect the M2 sections 222 to the M1 route 223.

Thus, the first transmission line TL1 and the second transmission line TL2 are edge coupled in M2 with a close spacing for efficient coupling. Additionally, the M2 route 221 and the M1 route 223 are substantially continuous along where the first transmission line 221 and the second transmission line 222 are edge coupled in M2. For example, within the spiraled structure in which the first transmission line TL1 and the second transmission line TL2 are electromagnetically coupled, the M2 route 221 and the M1 route 223 are unbroken. In certain implementations, a substantially continuous route of a transmission line in a given metal layer occupies the metal layer along at least 95% of the length of the transmission line. In contrast, the M2 sections 222 are segmented and connected to the M1 route 223 by vias.

Since upper metal (for instance, M2) is typically thicker than lower metal (for instance, M1), implementing the balun in this manner advantageously allows the first transmission line TL1 and the second transmission line TL2 to be implemented in thick metal with low resistance while still being closely spaced. This in turn provides low insertion loss through the balun 250, which enhances performance.

Although the balun 250 is implemented with the first transmission line TL1 substantially continuous and the second transmission line TL2 segmented, the teachings herein are also applicable to implementations in which the first transmission line TL1 is segmented and the second transmission line TL2 is substantially continuous.

Figure 3A:
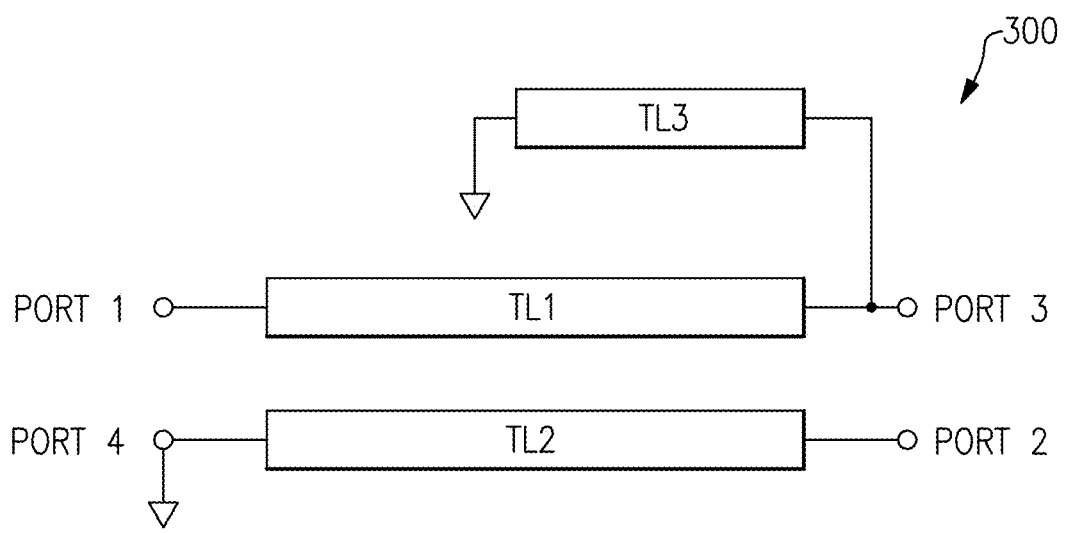
FIG. 3A is a schematic diagram of a balun according to another embodiment.

FIG. 3A is a schematic diagram of a balun 300 according to another embodiment. The balun 300 includes a first transmission line TL1, a second transmission line TL2, a third transmission line TL3, a first port 1, a second port 2, a third port 3, and a fourth port 4.

The balun 300 of FIG. 3A is similar to the balun 200 of FIG. 2A, except that the balun 300 further includes the third transmission line TL3. As shown in FIG. 3A, the third transmission line TL3 is electrically connected between the third port 3 and ground.

By including the third transmission line TL3, the bandwidth of the balun 300 is improved relative to the balun 200 of FIG. 2A. For example, the balun 300 is implemented as a broadband Ruthroff transmission line balun.

Figure 3B:
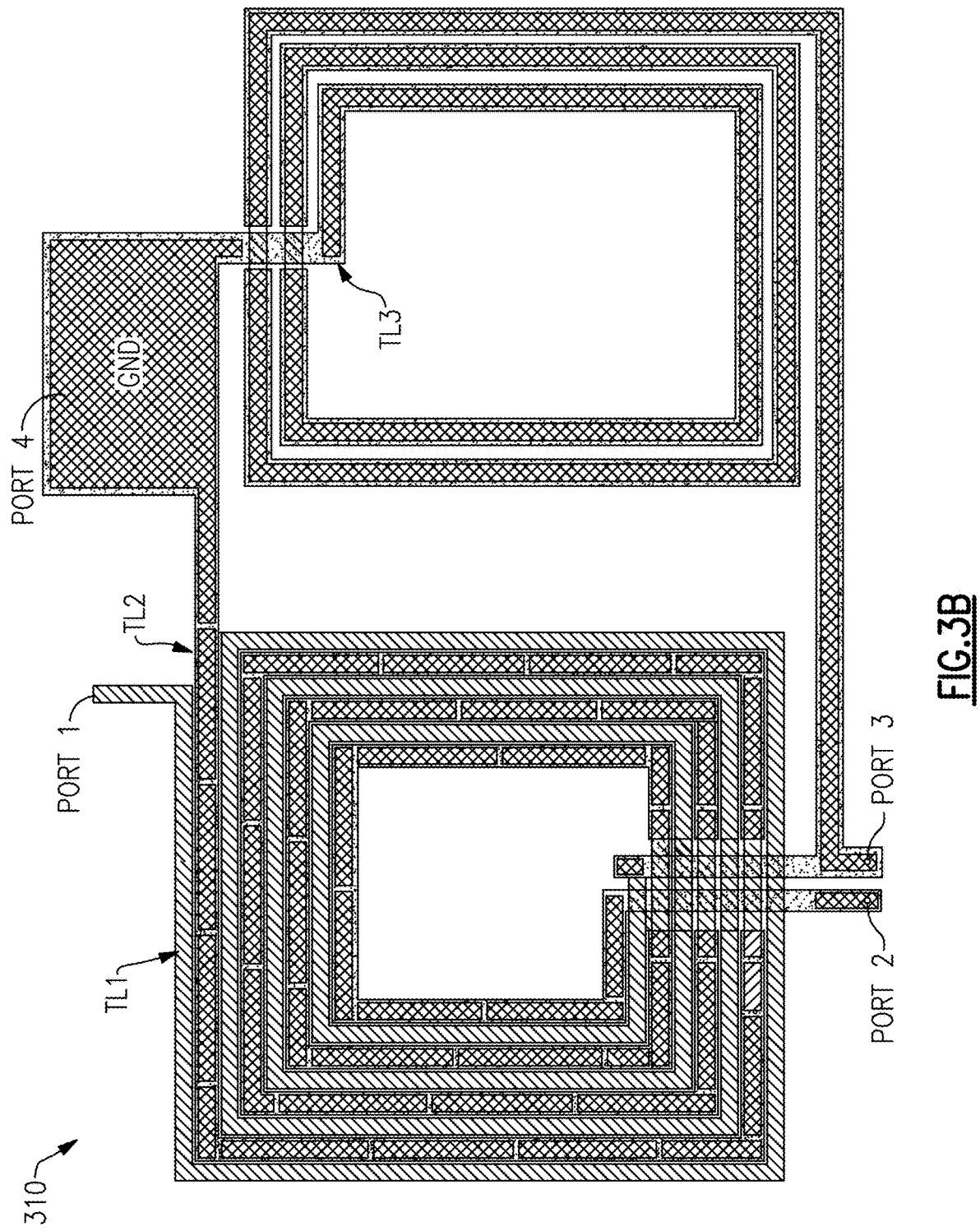
FIG. 3B is a schematic diagram of a balun according to another embodiment.

FIG. 3B is a schematic diagram of a balun 310 according to another embodiment. The balun 310 illustrates one embodiment of the balun 300 of FIG. 3A implemented in accordance with the teachings herein.

The balun 310 includes a first port 1, a second port 2, a third port 3, a fourth port 4 (corresponding to ground or GND, in this example), a first transmission line TL1, a second transmission line TL2, and a third transmission line TL3. The balun 310 is implemented using a first metallization layer (M1), a second metallization layer (M2), and vias interconnecting portions of M1 and M2.

The first transmission line TL1 and the second transmission line TL2 are implemented in a manner similar to that as the balun 250 of FIGS. 2B-2E. For example, the first transmission line TL1 includes an M2 route, while the second transmission line TL2 includes an M1 route that is connected to M2 sections by vias. In the illustrated embodiment, the third transmission line TL3 includes an M1 route and an M2 route connected by vias, and is implemented with a spiral shape to provide a compact layout. Thus, the third transmission line TL3 is substantially continuous in both M1 and M2, in this embodiment.

Figure 3D:
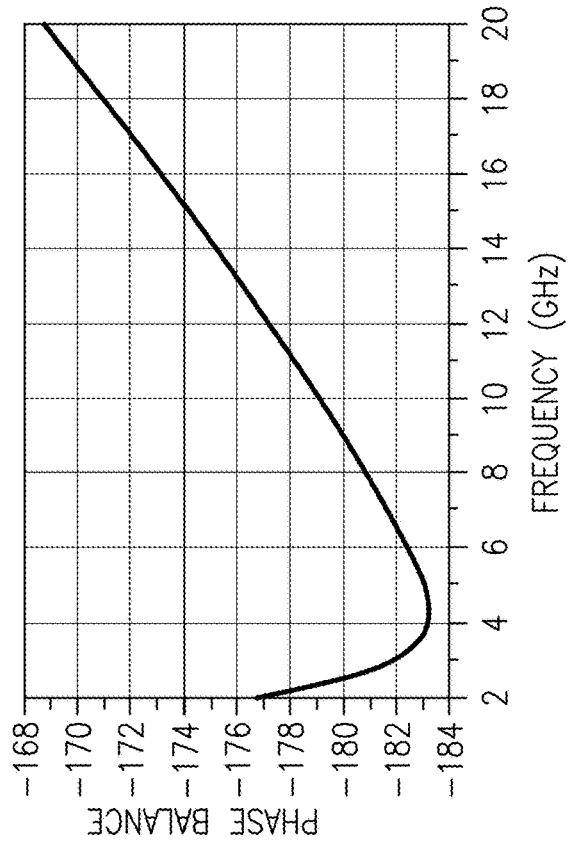
FIG. 3D is one example of a graph of phase balance versus frequency for the balun of FIG. 3B.
Figure 3C:
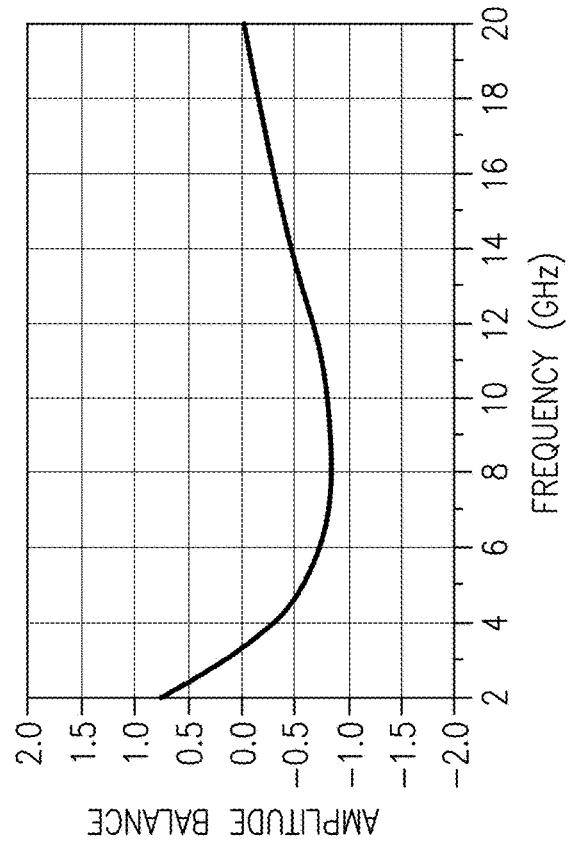
FIG. 3C is one example of a graph of amplitude balance versus frequency for the balun of FIG. 3B.

FIG. 3C is one example of a graph of amplitude balance versus frequency for the balun 310 of FIG. 3B.

FIG. 3D is one example of a graph of phase balance versus frequency for the balun 310 of FIG. 3B.

As shown in FIGS. 3C and 3D, the balun 310 exhibits excellent phase and amplitude balance over a broadband frequency range (spanning over a decade of frequency between 2 GHz and 20 GHz). Such wideband baluns with high balance can be used in a wide range of applications, including, but not limited to, push-pull amplifiers and/or mixers to achieve superior linearity and/or wider bandwidth.

Although one example of simulation results for a balun have been provided, results can vary based on a wide variety of factors, such as circuit and layout implementation, simulation tools, simulation models, and/or simulation parameters. Accordingly, other results are possible.

Figure 4A:
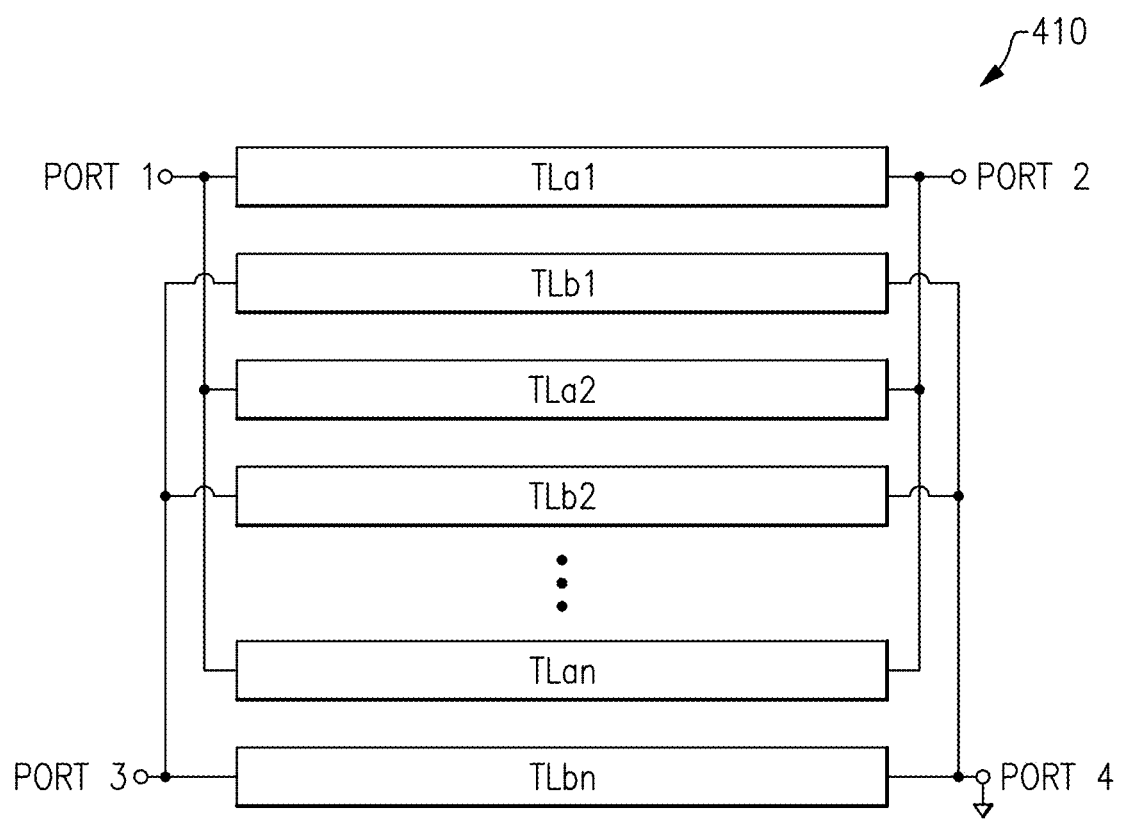
FIG. 4A is a schematic diagram of an interdigital coupler according to one embodiment.

FIG. 4A is a schematic diagram of an interdigital coupler 410 according to one embodiment. The interdigital coupler 410 includes a first port 1, a second port 2, a third port 3, a fourth port 4, a first group of transmission lines TLa1, TLa2, ... TLan, and a second group of transmission lines TLb1, TLb2, ... TLbn.

As shown in FIG. 4A, the first group of transmission lines TLa1, TLa2, . . . TLan are electrically connected in parallel with one another between the first port 1 and the second port 2. Additionally, the second group of transmission lines TLb1, TLb2, . . . TLbn are electrically connected in parallel with one another between the third port 3 and the fourth port 4. In certain implementations, the fourth port 4 is grounded.

In the illustrated embodiment, transmission lines from the first group are alternated with transmission lines from the second group. For example, the transmission line TLb1 of the second group is positioned between transmission lines TLa1 and TLa2 of the first group.

Although show as including three transmission lines in each group, more or fewer transmission lines can be included as indicated by the ellipses.

One or more transmission lines of the first group and second group can be implemented in accordance with any of the coupled line structures herein.

Figure 4B:
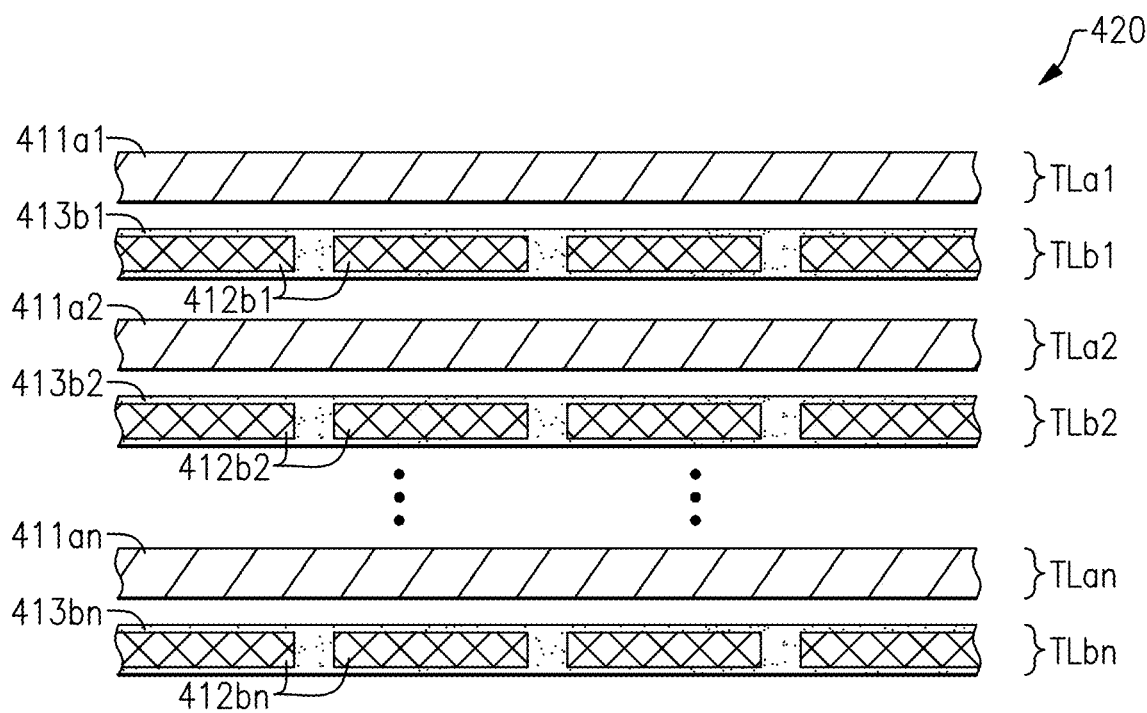
FIG. 4B is a plan view of an interdigital coupler according to another embodiment.

FIG. 4B is a plan view of an interdigital coupler 420 according to another embodiment. The interdigital coupler 420 illustrates one embodiment of the interdigital coupler 410 of FIG. 4A implemented in accordance with the teachings herein. As shown in FIG. 4B, implementations in metal for the first group of transmission lines TLa1, TLa2, . . . TLan and the second group of transmission lines TLb1, TLb2, . . . TLbn are depicted. For clarity of the figure, the first port 1, the second port 2, the third port 3, and the fourth port 4 are not shown in FIG. 4B.

In the illustrated embodiment, the first group of transmission lines TLa1, TLa2, . . . TLan are implemented using M2 routes 411a1, 411a2, . . . 411an, respectively. Additionally, the second group of transmission lines TLb1, TLb2, . . . TLbn are implemented using M1 routes 413b1, 413b2, . . . 413bn and M2 sections 412b1, 412b2, . . . 412bn, respectively. Additionally, the M1 routes 413b1, 413b2, . . . 413bn are connected to corresponding M2 sections 412b1, 412b2, . . . 412bn using vias. Additional details of the metallization of the interdigital coupler 420 of FIG. 4B are similar to that of the coupled line structure 120 of FIGS. 1A and 1B.

Figure 5A:
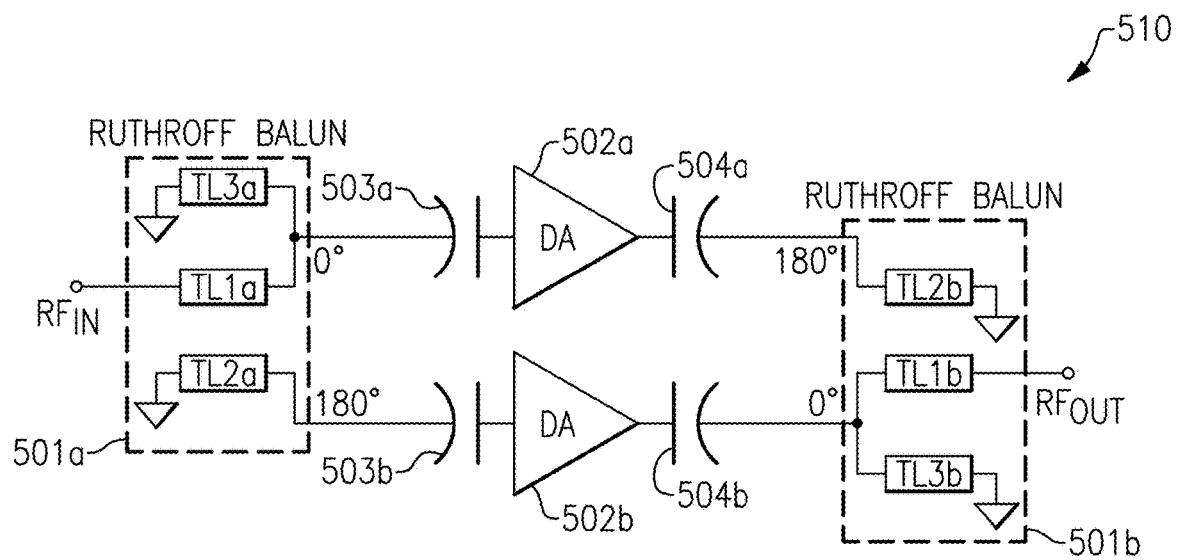
FIG. 5A is a schematic diagram of a push-pull amplifier according to one embodiment.

FIG. 5A is a schematic diagram of a push-pull amplifier 510 according to one embodiment. The push-pull amplifier 510 includes a first balun 501a, a second balun 501b, a first driver amplifier 502a, a second driver amplifier 502b, a first input DC blocking capacitor 503a, a second input DC blocking capacitor 503b, a first output DC blocking capacitor 504a, and a second output DC blocking capacitor 504b.

As shown in FIG. 5A, the first balun 501a and the second balun 501b are each implemented as broadband Ruthroff transmission line balun. The first balun 501a includes a first transmission line TL1a, a second transmission line TL2a, and a third transmission line TL3a, while the second balun 501b includes a first transmission line TL1b, a second transmission line TL2b, and a third transmission line TL3b.

The first balun 501a and/or the second balun 502b can be implemented using any of the coupled line structures described herein. For example, in certain implementations, the first balun 501a and the second balun 502b are implemented in accordance with the balun 310 of FIG. 3B.

In the illustrated embodiment, an input of the first driver amplifier 502a is electrically connected to an RF input terminal $RF_{IN}$ by way of the first input DC blocking capacitor 503a and the first transmission line TL1a of the first balun 501a. Additionally, an input of the second driver amplifier 502b is electrically connected to ground by way of the second input DC blocking capacitor 503b and the second transmission line TL2a of the first balun 501a.

With continuing reference to FIG. 5A, an output of the first driver amplifier 502a is electrically connected to ground by way of the first output DC blocking capacitor 504a and the second transmission line TL2b of the second balun 501b. Additionally, an output of the second driver amplifier 502b is electrically connected to an RF output terminal $RF_{OUT}$ by way of the second output DC blocking capacitor 504b and the first transmission line TL1b of the second balun 501b. Furthermore, the third transmission line TL3a of the first balun 501a is electrically connected between the first input DC blocking capacitor 503a and ground, while the third transmission line TL3b of the second balun 501b is electrically connected between the second output DC blocking capacitor 504b and ground.

The push-pull amplifier 510 has also been annotated with phases for a differential input voltage across the inputs of the driver amplifiers and for phases for a differential output voltage across the outputs of the driver amplifiers. As shown in FIG. 5A, the push-pull amplifier operates in a push-pull configuration.

A push-pull amplifier has a distortion impacted by a phase and/or amplitude balance of a balun. For instance, a push-pull amplifier balances out even harmonics at the amplifier's output leaving the third harmonic as the principal source of distortion, and thus possesses inherent spurious signal rejection of even order distortion. Thus, phase/amplitude balance is important to achieve high output second-order intercept point (OIP2) and/or second-order harmonic distortion (HD2) for the push-pull amplifier. While narrow-band push-pull power amplifiers can improve OIP2 over single-ended topologies, broadband push-pull amplifiers have been infeasible due to an absence of a broadband balun with small phase/amplitude imbalance.

By implementing the baluns of a push-pull amplifier in accordance with the teachings here, superior balance, wide-band operation, and/or a compact layout can be achieved.

Figure 5B:
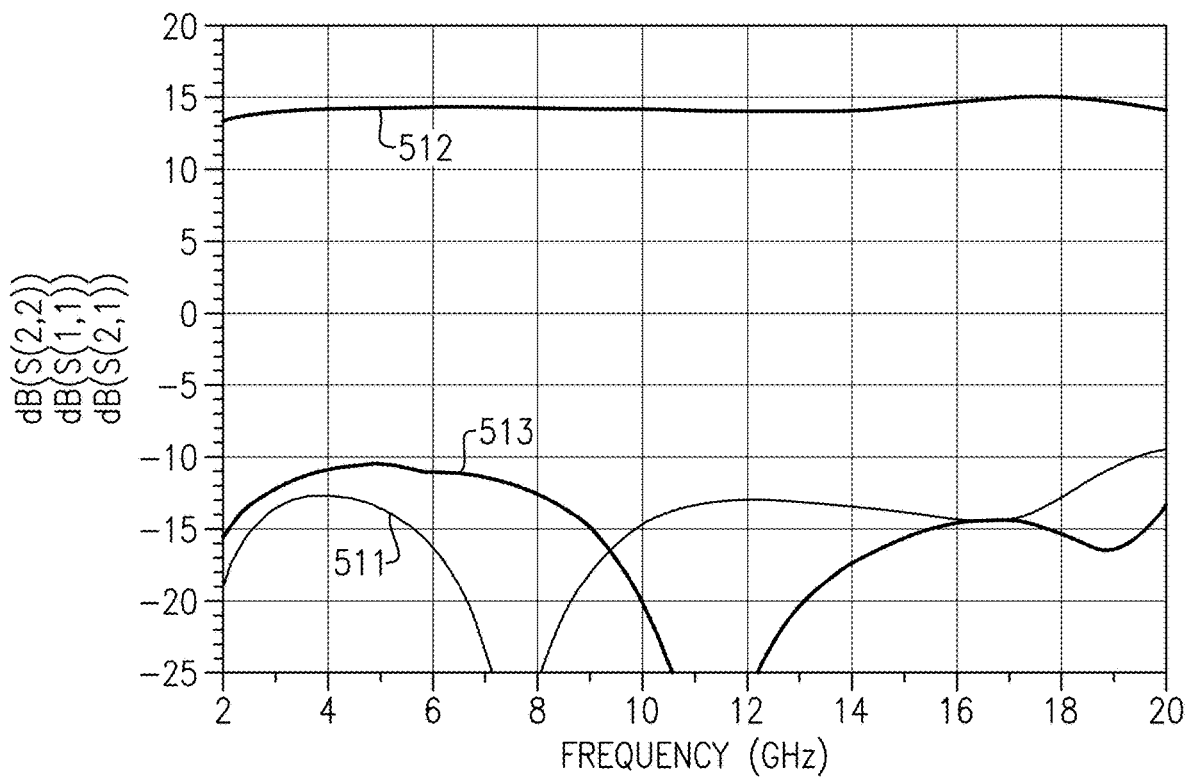
FIG. 5B is a graph of one example of plots of s-parameters versus frequency for the push-pull amplifier of FIG. 5A.

FIG. 5B is a graph of one example of plots of s-parameters versus frequency for the push-pull amplifier 510 of FIG. 5A. The graph includes a first plot 511 of S11, a second plot 512 of S21, and a third plot 513 of S22.

Figure 5C:
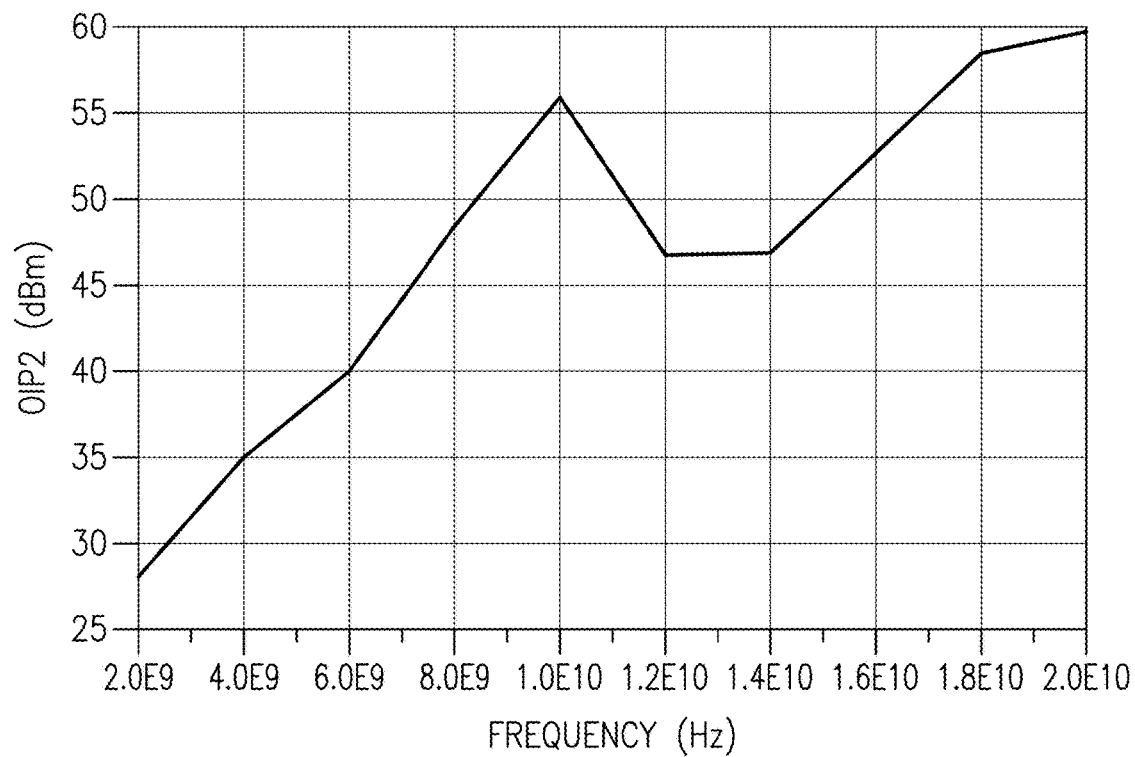
FIG. 5C is a graph of one example of second-order output intercept point (OIP2) versus frequency for the push-pull amplifier of FIG. 5A.

FIG. 5C is a graph of one example of second-order output intercept point (OIP2) versus frequency for the push-pull amplifier 510 of FIG. 5A.

The graphs of FIGS. 5B and 5C correspond to simulations of one implementation of the push-pull amplifier 510 of FIG. 5A in which the first balun 501a and the second balun 501b are each implemented using an instantiation of the balun 310 of FIG. 3B.

Although one example of simulation results for a push-pull amplifier have been provided, results can vary based on a wide variety of factors, such as circuit and layout implementation, simulation tools, simulation models, and/or simulation parameters. Accordingly, other results are possible.

Figure 6:
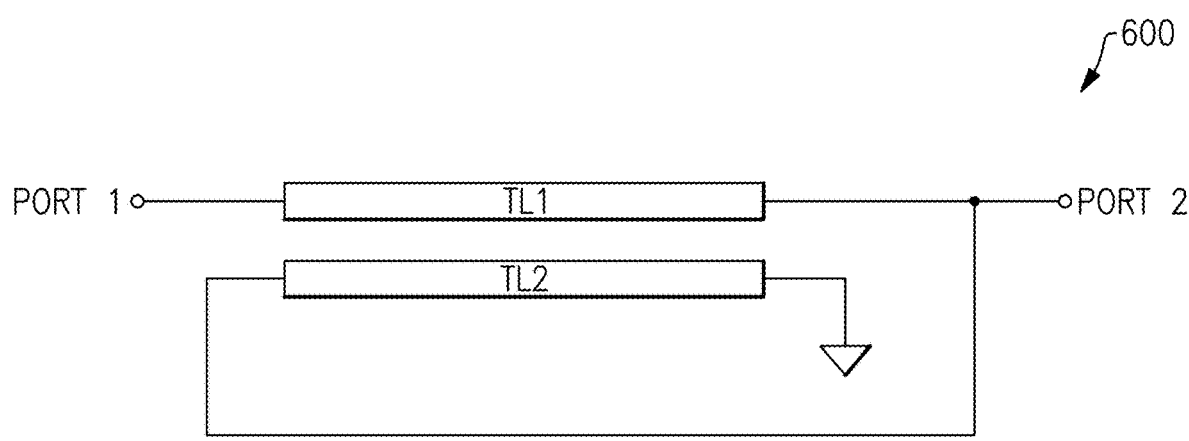
FIG. 6 is a schematic diagram of an impedance transformer according to one embodiment.

FIG. 6 is a schematic diagram of an impedance transformer 600 according to one embodiment. The impedance transformer 600 includes a first port 1, a second port 2, a first transmission line TL1, and a second transmission line TL2. As shown in FIG. 6, the first transmission line TL1 is electrically connected between the first port 1 and the second port 2. Additionally, the second transmission line is electrically connected between the second port 2 and ground. The impedance transformer 600 operates to provide an impedance transformation between the first port 1 and the second port 2.

The first transmission line TL1 and the second transmission line TL2 can be implemented using any of the coupled line structures described herein. In a first example, the first transmission line TL1 is implemented in accordance with the transmission line TLa of the coupled line structure 120 FIGS. 1A and 1B, while the second transmission line TL2 is implemented in accordance with the transmission line TLb of the coupled line structure 120 FIGS. 1A and 1B. In a second example, the first transmission line TL1 is implemented in accordance with the transmission line TLb of the coupled line structure 120 FIGS. 1A and 1B, while the second transmission line TL2 is implemented in accordance with the transmission line TLa of the coupled line structure 120 FIGS. 1A and 1B.

Figure 7:
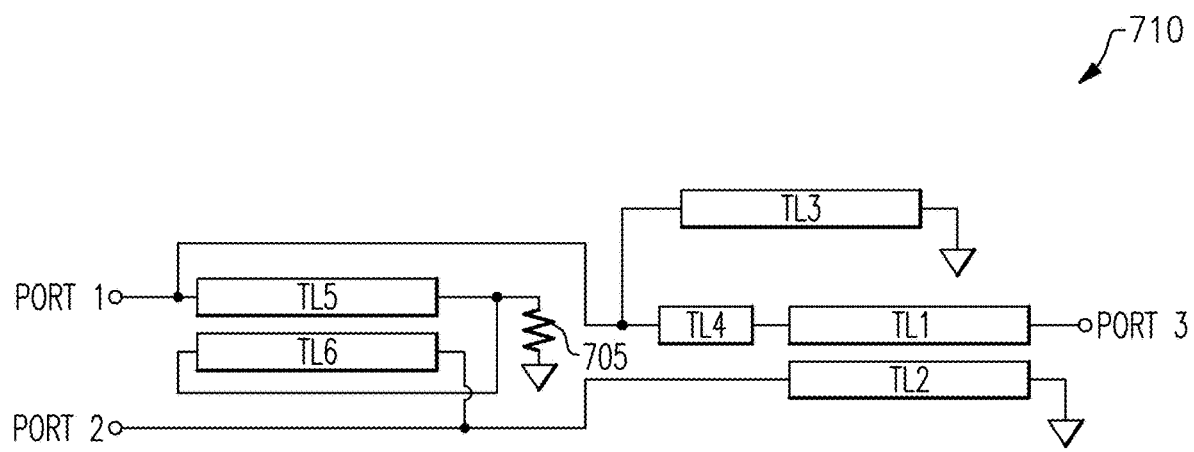
FIG. 7 is a schematic diagram of a two-way power combiner according to one embodiment.

FIG. 7 is a schematic diagram of a two-way power combiner 710 according to one embodiment. The two-way power combiner 710 includes a first port 1, a second port 2, a third port 3, a first transmission line TL1, a second transmission line TL2, a third transmission line TL3, a fourth transmission line TL4, a fifth transmission line TL5, a sixth transmission line TL6, and a termination resistor 705.

As shown in FIG. 7, the fourth transmission line TL4 and the first transmission line TL1 are electrically connected in series between the first port 1 and the third port 3. Additionally, the second transmission line TL2 is electrically connected between the second port 2 and ground, and the third transmission line TL3 is electrically connected between the first port 1 and ground. Furthermore, the fifth transmission line TL5 includes a first end electrically connected to the first port 1 and a second electrically connected to a first end of the sixth transmission line TL6 and to a first end of the termination resistor 705. The termination resistor 705 further includes a second end electrically connected to ground, and the sixth transmission line TL6 further includes a second end electrically connected to the second port 2.

The first transmission line TL1 and the second transmission line TL2 are coupled to one another. The first transmission line TL1 and the second transmission line TL2 can be coupled to one another in accordance with any of the coupled line structures herein. The fifth transmission line TL5 and the sixth transmission line TL6 are also coupled to one another. The fifth transmission line TL5 and the sixth transmission line TL6 can be coupled to one another in accordance with any of the coupled line structures herein.

When operated as a combiner, the two-way power combiner 710 serves to combine a first RF signal received at the first port 1 with a second RF signal received at the second port 2 to generate a combined RF signal at the third port 3. The two-way power combiner 710 can also be operated as a power divider by providing an RF signal to the third port 3.

Figure 8:
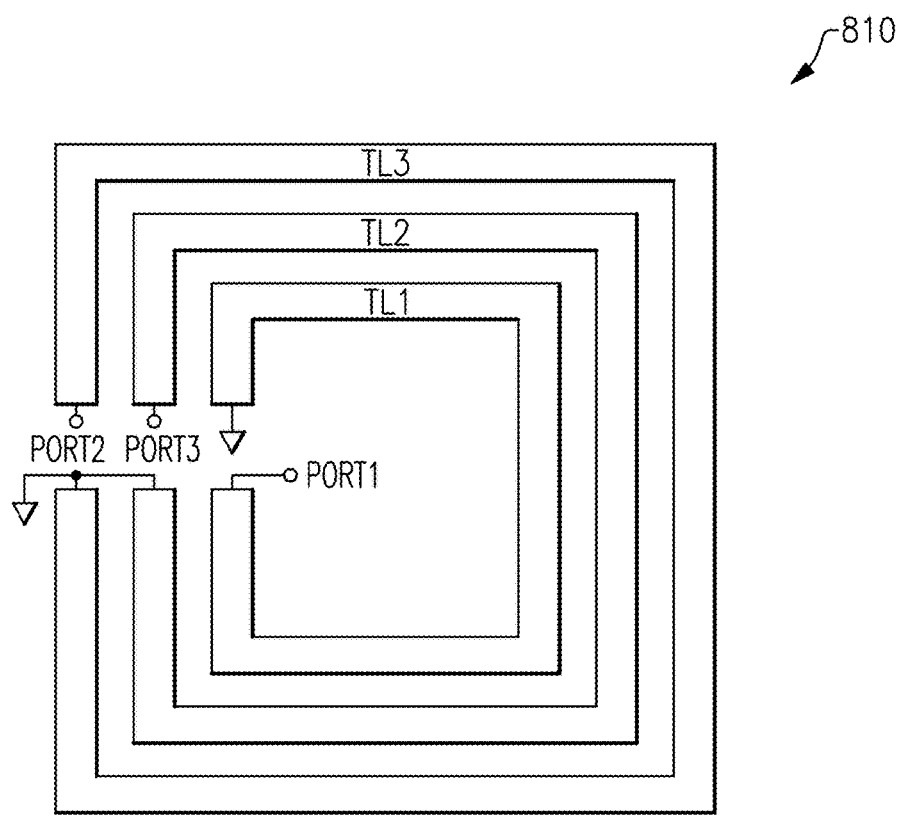
FIG. 8 is a schematic diagram of a coupled line triformer according to one embodiment.

FIG. 8 is a schematic diagram of a coupled line triformer 810 according to one embodiment. The coupled line triformer 810 includes a first port 1, a second port 2, a third port 3, a first transmission line TL1, a second transmission line TL2, and a third transmission line TL3.

As shown in FIG. 8, the first transmission line TL1 is electrically connected between ground and the first port 1, and has a loop shape. Additionally, the second transmission line TL2 is electrically connected between the third port 3 and ground, and also has a loop shape. Furthermore, the third transmission line TL3 is electrically connected between the second port 2 and ground, and also has a loop shape. The second transmission line TL2 is positioned between the first transmission line TL1 and the third transmission line TL3, in this embodiment.

The first transmission line TL1, the second transmission line TL2, and the third transmission line TL3 can be implemented using any of the coupled line structures described herein. In a first example, the first transmission line TL1 is implemented as a first M2 route, the third transmission line is implemented as a second M2 route, and the second transmission line is implemented as segments in M2 connected to an M1 route using vias. In a second example, the first transmission line TL1 and the third transmission line TL3 are each segmented in M2 and connected by vias to corresponding M1 routes, while the second transmission line TL2 is implemented as an M2 route.

Figure 9:
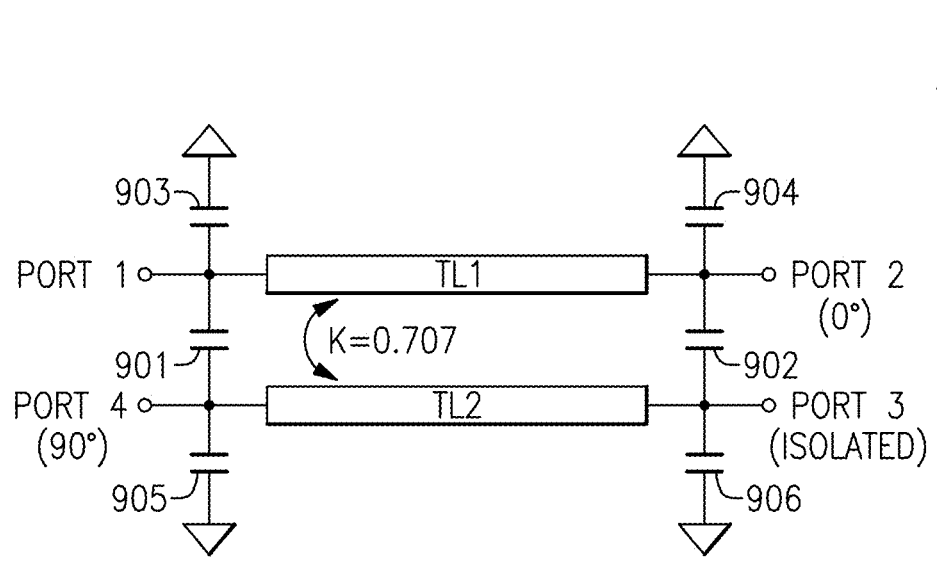
FIG. 9 is a schematic diagram of a lumped quadrature coupler according to one embodiment.

FIG. 9 is a schematic diagram of a lumped quadrature coupler 910 according to one embodiment. The lumped quadrature coupler 910 includes a first port 1, a second port 2, a third port 3, a fourth port 4, a first transmission line TL1, a second transmission line TL2, a first capacitor 901, a second capacitor 902, a third capacitor 903, a fourth capacitor 904, a fifth capacitor 905, and a sixth capacitor 906.

As shown in FIG. 9, the first transmission line TL1 includes a first end electrically connected to the first port 1 and a second end that is electrically connected to the second port 2. Additionally, the second transmission line TL2 includes a first end electrically connected to the fourth port 4 and a second end electrically connected to the third port.

With continuing reference to FIG. 9, the first capacitor 901 is electrically connected between the first end of the first transmission line TL1 and the first end of the second transmission line TL2. Additionally, the second capacitor 902 is electrically connected between the second end of the first transmission line TL1 and the second end of the second transmission line TL2. Furthermore, the third capacitor 903 is electrically connected between the first end of the first transmission line TL1 and ground, while the fourth capacitor 904 is electrically connected between the second end of the first transmission line TL1 and ground. Additionally, the fifth capacitor 905 is electrically connected between the first end of the second transmission line TL2 and ground, while the sixth capacitor 906 is electrically connected between the second end of the second transmission line TL2 and ground.

The first transmission line TL1 and the second transmission line TL2 can be implemented using any of the coupled line structures described herein.

Figure 10:
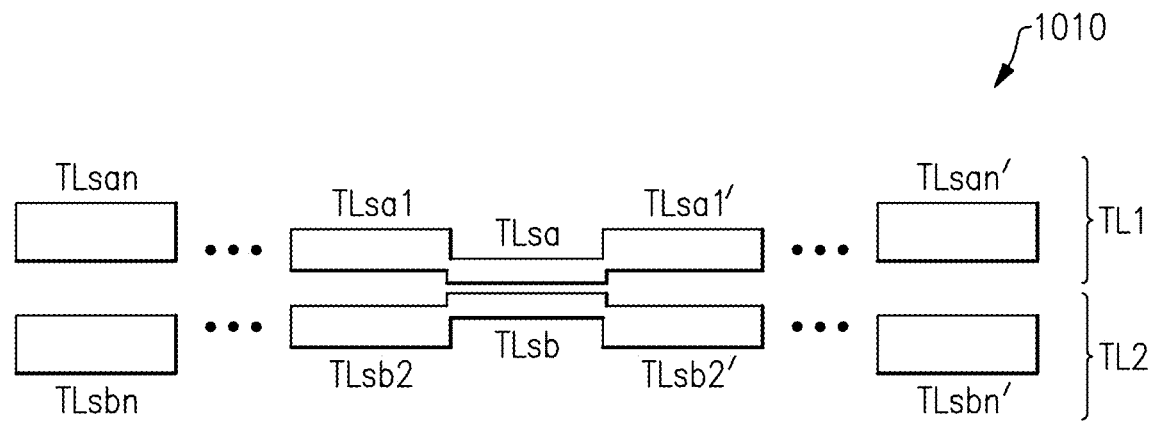
FIG. 10 is a schematic diagram of a multi-section symmetrical coupler according to one embodiment.

FIG. 10 is a schematic diagram of a multi-section symmetrical coupler 1010 according to one embodiment. The multi-sectional symmetrical coupler 1010 includes a first transmission line TL1 and a second transmission line TL2, each of which includes multiple sections.

For example, the first transmission line TL1 includes sections TLsan, . . . TLsa1, TLsa, TLsa1', . . . TLsan'. Additionally, the second transmission line TL2 includes sections TLsbn, . . . TLsb1, TLsb, TLsb1', . . . TLsbn'. As shown in FIG. 10, the corresponding sections of the first transmission line TL1 and the second transmission line TL2 are separated by different distances, with the section TLsa and the section TLsb being the pair of corresponding sections that are most closely spaced.

The first transmission line TL1 and the second transmission line TL2 can be implemented in accordance with the teachings herein. In certain implementations, one of the transmission line section TLsa or the transmission line section TLsb is implemented as an M2 route, while the other of the transmission line section TLsa or the transmission line section TLsb is implemented as an M1 route connected to M2 sections by vias.

Figure 11A:
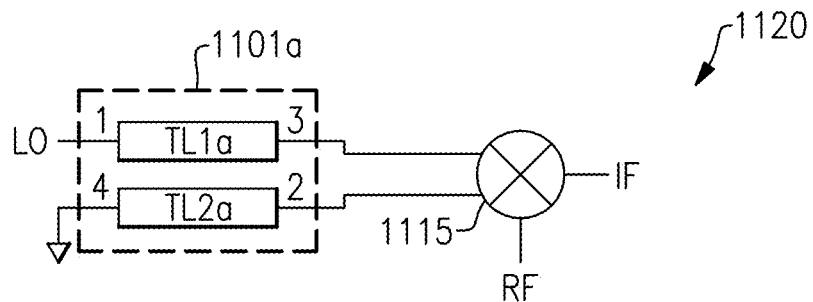
FIG. 11A is a schematic diagram of a single balanced mixer according to one embodiment.

FIG. 11A is a schematic diagram of a single balanced mixer 1120 according to one embodiment. The single balanced mixer 1120 includes a balun 1101a and a mixer 1115. The balun 1101a includes a first transmission line TL1a and a second transmission line TL2a. The balun 1101a can be implemented in accordance with any of the coupled line structures herein.

As shown in FIG. 11A, the first port 1 of the balun 1101a receives a single-ended local oscillator (LO) signal, while the fourth port 4 of the balun 1101a is grounded. Additionally, the balun 1101a generates a differential LO signal between the third port 3 and the second port 2. The differential LO signal is provided to a differential input of the mixer 1115.

The mixer 1115 further receives an intermediate frequency (IF) signal and generates a radio frequency (RF) signal, or vice versa. For example, the IF signal can be received and the RF signal generated when the single balanced mixer 1120 is providing frequency upconversion, while the RF signal can be received and the IF signal generated when the single balanced mixer 1120 is providing frequency downconversion.

Figure 11B:
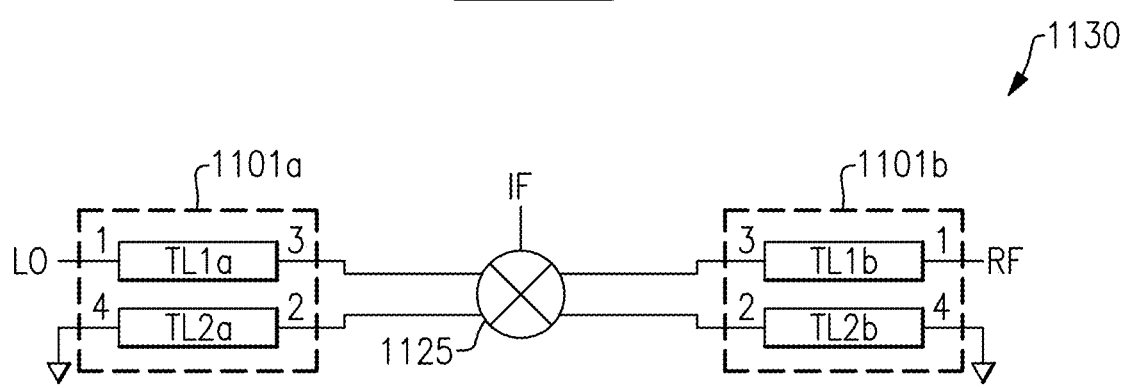
FIG. 11B is a schematic diagram of a double balanced mixer according to one embodiment.

FIG. 11B is a schematic diagram of a double balanced mixer 1130 according to one embodiment. The double balanced mixer 1130 includes a first balun 1101a, a second balun 1101b, and a mixer 1125. The first balun 1101a includes a first transmission line TL1a and a second transmission line TL2a, while the second balun 1101b includes a first transmission line TL1b and a second transmission line TL2b.

As shown in FIG. 11B, the first port 1 of the first balun 1101a receives a single-ended LO signal, while the fourth port of the first balun 1101a is grounded. Additionally, the first balun 1101a generates a differential LO signal between the first balun's third port 3 and second port 2, and provides the differential LO signal to a differential input of the mixer 1125.

When providing frequency upconversion, the mixer 1125 receives an IF signal, and generates a differential RF signal that is provided across the third port 3 and the second port 2 of the second balun 1101b. Additionally, the fourth port 4 of the second balun 1101b is grounded, and the first port 1 of the second balun 1101b outputs a single-ended RF signal.

When providing frequency downconversion, the second balun 1101b receives the single-ended RF signal at the first port 1, and generates the differential RF signal across the second balun's third port 3 and second port 2. Additionally, the mixer 1125 receives the differential RF signal, and generates the IF signal.

The double balanced mixer 1130 illustrates another embodiment of an electronic system implemented in accordance with the teachings herein. For example, the first balun 1101a and/or the second balun 1101b can be implemented in accordance with any of the coupled line structures herein.

Figure 11C:
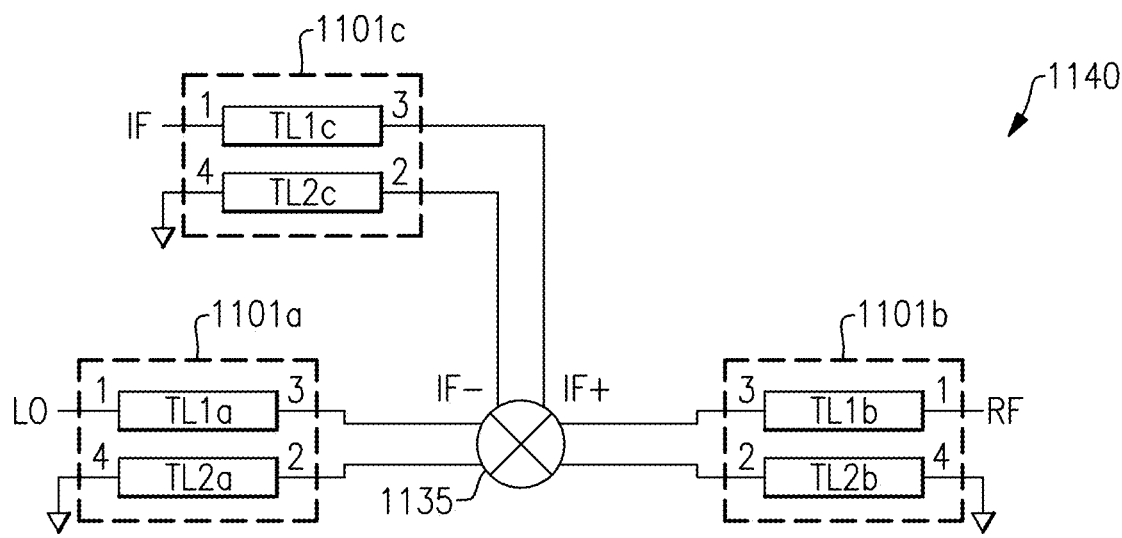
FIG. 11C is a schematic diagram of a double balanced mixer according to another embodiment.

FIG. 11C is a schematic diagram of a double balanced mixer 1140 according to another embodiment. The double balanced mixer 1140 includes a first balun 1101a, a second balun 1101b, a third balun 1101c, and a mixer 1135. The first balun 1101a includes a first transmission line TL1a and a second transmission line TL2a, the second balun 1101b includes a first transmission line TL1b and a second transmission line TL2b, and the third balun 1101c includes a first transmission line TL1c and a second transmission line TL2c.

The double balanced mixer 1140 of FIG. 11C is similar to the double balanced mixer 1130 of FIG. 11B, except that the double balanced mixer 1140 of FIG. 11C further includes the third balun 1101c to provide single-ended to differential signal conversion of the IF signal. Thus, when providing frequency upconversion, a single-ended IF signal is provided to the first port 1 of the third balun 1101c while the third balun's fourth port 4 is grounded, and a differential IF signal (IF+/IF−) is generated across the third balun's third port 3 and second port 2. Additionally, when providing frequency downconversion, the mixer 1135 provides the differential IF signal across the third port 3 and the second port 2 of the third balun 1101c, and the first port 1 of the third balun 1101c outputs the signal-ended IF signal.

The double balanced mixer 1140 illustrates another embodiment of an electronic system implemented in accordance with the teachings herein. For example, the first balun 1101a, the second balun 1101b, and/or the third balun 1101c can be implemented in accordance with any of the coupled line structures herein.

Applications

Devices employing the above described schemes can be implemented into various electronic systems. Examples of the electronic systems can include, but are not limited to, consumer electronic products, parts of the consumer electronic products, electronic test equipment, communication infrastructure applications, etc. Further, the electronic systems can include unfinished products, including those for communication, industrial, medical and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A semiconductor die with an integrated wideband coupled line structure, the semiconductor die comprising:
   two or more metallization layers including a first metallization layer and a second metallization layer that is thicker than the first metallization layer;
   a first transmission line formed in the two or more metallization layers; and
   a second transmission formed in the two or more metallization layers and coupled to the first transmission line,
   wherein the first transmission line is substantially continuous in the second metallization layer, and the second transmission line is segmented in the second metallization layer.

2. The semiconductor die of claim 1, wherein the first transmission line and the second transmission line are edge coupled in the second metallization layer.

3. The semiconductor die of claim 1, wherein the first transmission line and the second transmission line are separated by a minimum design rule spacing of the second metallization layer.

4. The semiconductor die of claim 1, wherein the second transmission line is substantially continuous in the first metallization layer and connected to a plurality of metal segments in the second metallization layer by way of a plurality of vias.

5. The semiconductor die of claim 1, wherein the two or more metallization layers include exactly two metallization layers.

6. The semiconductor die of claim 1, further comprising a compound semiconductor substrate over which the two or more metallization layers are formed, wherein the compound semiconductor substrate includes gallium arsenide (GaAs) or gallium nitride (GaN).

7. The semiconductor die of claim 1, wherein the second metallization layer is an outermost metal layer of the semiconductor die.

8. The semiconductor die of claim 1, wherein the first transmission line and the second transmission line each have a spiral shape.

9. The semiconductor die of claim 1, wherein the first transmission line and the second transmission line operate as a balun.

10. The semiconductor die of claim 1, further comprising a first amplifier having an input electrically connected to the first transmission line, and a second amplifier having an input electrically connected to the second transmission line.

11. A coupled line structure with wide bandwidth, the coupled line structure comprising:
   a first transmission line including a first metal route in an upper metallization layer of a semiconductor die; and
   a second transmission line including a plurality of metal segments in the upper metallization layer, a second metal route in a lower metallization layer of the semiconductor die, and a plurality of vias connecting the second metal route to the plurality of metal segments,
   wherein the first metal route of the first transmission line is coupled to the plurality of metal segments of the second transmission line.

12. The coupled line structure of claim 11, further comprising a semiconductor substrate, the lower metallization layer positioned between the upper metallization layer and the semiconductor substrate.

13. The coupled line structure of claim 12, further comprising a ground plane on a side of the semiconductor substrate opposite the lower metallization layer.

14. The coupled line structure of claim 12, wherein the semiconductor substrate includes gallium arsenide (GaAs) or gallium nitride (GaN).

15. The coupled line structure of claim 11, further comprising a first port connected to a first end of the first metal route, a ground port connected to a first end of the second metal route, a second port connected to a second end of the second metal route, and a third port connected to a second end of the first metal route, the first transmission line and the second transmission line configured to operate as a balun.

16. The coupled line structure of claim 11, wherein the first metal route and the second metal route are each implemented with a spiral shape.

17. The coupled line structure of claim 11, wherein the first metal route is thicker than the second metal route.

18. A method of transmission line coupling, the method comprising:
   providing a radio frequency signal to a first transmission line, the first transmission line including a first metal route in an upper metallization layer of a semiconductor die;
   coupling the radio frequency signal from the first transmission line to a second transmission line, the second transmission line including a plurality of metal segments in the upper metallization layer; and
   providing the coupled radio frequency signal to a second metal route of the second transmission line by way of a plurality of vias, the second metal route in a lower metallization layer of the semiconductor die.

19. The method of claim 18, further comprising converting the radio frequency signal from an unbalanced signal to a balanced signal using the first transmission line and the second transmission line.

20. The method of claim 18, wherein the upper metallization layer is thicker than the lower metallization layer.

* * * * *